United States Patent [19]
Kodama

[11] Patent Number: 5,883,835
[45] Date of Patent: Mar. 16, 1999

[54] CONTROL METHOD FOR NON-VOLATILE MEMORY

[75] Inventor: Noriaki Kodama, Tokyo, Japan

[73] Assignee: NEC Corporation, Tokyo, Japan

[21] Appl. No.: 859,229

[22] Filed: May 19, 1997

[30] Foreign Application Priority Data

May 17, 1996 [JP] Japan .................................. 8-148311

[51] Int. Cl.$^6$ .................................................. G11C 16/04
[52] U.S. Cl. ............................... 365/185.28; 365/185.01; 365/185.26
[58] Field of Search .................... 365/185.01, 185.15, 365/185.16, 185.14, 185.26

[56] References Cited

U.S. PATENT DOCUMENTS

| | | | |
|---|---|---|---|
| 5,091,882 | 2/1992 | Naruke | 365/185.14 |
| 5,338,952 | 8/1994 | Yamauchi | 365/185.15 |
| 5,349,220 | 9/1994 | Hong | 365/185.15 |
| 5,463,579 | 10/1995 | Shimoji | 365/185.16 |

FOREIGN PATENT DOCUMENTS 5258583  10/1993  Japan .

OTHER PUBLICATIONS

K. Oyama et al, "A Novel Erasing Technology for 3.3V Flash memory with 64MB Capacity and Beyond", 1992 IEEE, IEEE Int'l Electron Device Meeting (IEDM) pp. 607–610.

*Primary Examiner*—David Nelms
*Assistant Examiner*—Thong Le
*Attorney, Agent, or Firm*—Sughrue, Mion, Zinn, Macpeak & Seas, PLLC

[57] ABSTRACT

In a memory cell including a floating gate, a gate insulation film and a control gate, after removing injected charges from the floating gate with tunneling currents through the gate insulation film, charges are removed from the gate insulation film by applying a pair of positive and negative voltage pulses to the control gate at least one time.

24 Claims, 6 Drawing Sheets

CONTROL METHOD FOR NON-VOLATILE MEMORY

BACKGROUND OF THE INVENTION

1. Field of the Invention

The present invention generally relates to a non-volatile semiconductor memory, and in particular to a control method for a non-volatile memory including a floating gate.

2. Description of the Related Art

In a flash memory cell array where the cell data stored in a plurality of selected cells can be erased concurrently, the cell data are usually erased with Fowler-Nordheim (F-N) tunneling currents to emit the electrons stored in the floating gate to the source or the substrate. However, there is distribution of the F-N tunneling current caused by distribution of physical parameters such as the thickness of gate insulation film and the overlapped area of the source and the floating gate among memory cells. The distribution of the F-N tunneling current causes the distribution of the erased cell threshold voltage (erased-$V_{TM}$).

To suppress this erased-$V_{TM}$ distribution, there has been proposed the 2-step erasing method in the article "A Novel Erasing Technology for 3.3 V Flash Memory with 64 Mb Capacity and Beyond" written by Okazawa et al. (IEEE International Electron Device Meeting (IEDM) 92, pp. 607–610, 1992) and Japanese Patent Unexamined Publication No. 5-258583. The 2-step erasing method consists of two different cell gate bias conditions. In the IEDM a first document step, a negative high voltage is applied to the control gates of the cells to erase the cell data, and in a second step, a positive high voltage is applied to decrease the erased-$V_{TM}$ distribution (see FIG. 6). According to a control method disclosed in the Publication (5-258583), in the first step, a negative high voltage is applied to the control gates of the cells and, at the same time, a positive voltage is applied to the source to erase the cell data.

SUMMARY OF THE INVENTION

The inventor, however, found that the trapped holes in the gate insulation film causes deterioration of memory performance. In particular the trapped holes in the side facing the gate insulation film remain even after the above 2-step erasing method has been performed. More specifically, during cell data erasing, pairs of electron and hole are generated due to the tunnel phenomena of electrons from the valence band to the conduction band in a strong depletion layer formed in the side of the P-type substrate facing the N-type source when a positive voltage is applied to the source. The generated electrons move into the source and the generated holes are mostly injected into the substrate but partly into the gate insulation film. Therefore, the number of trapped holes in the gate insulation film is increased each time the cell data erasing is performed.

The trapped holes in the side of the gate insulation film facing the substrate cause the effective energy barrier of the gate insulation film to be reduced with respect to the substrate. Such a reduced energy barrier causes erroneous injection of electrons into the floating gate through the gate insulation film when a positive voltage is applied to the control gate to read data from the memory cell. The injected electrons cause a shift of a threshold level of the memory cell from an erasing level to a writing level. This causes so-called gate disturbance, that is, an erroneous writing problem.

On the other hand, the trapped holes in the side of the gate insulation film facing the floating gate cause the effective energy barrier of the gate insulation film to be reduced with respect to the floating gate. Almost all the former trapped holes are moved from the gate insulation film to the substrate by applying the positive high voltage to the control gate in the second step. However, the latter trapped holes remain in the side of the gate insulation film facing the floating gate even after the second step.

An object of the present invention is to provide a control method for a non-volatile memory which can achieve the prevention of deterioration of data memory characteristic.

Another object of the present invention is to provide a control method for a non-volatile memory which can achieve the increased number of times that cell data are erased and written.

According to the present invention, in a memory cell of a non-volatile memory, the memory cell comprising a floating gate facing a substrate through a first insulation film and a control gate provided on the floating gate through a second insulation film, after injected charges are removed from the floating gate with tunneling currents through the first insulation film, charges are removed from the first insulation film. To remove the charges from the first insulation film, a pair of positive and negative voltage pulses with respect to the substrate may be applied to the control gate at least one time.

The present invention also comprises a controller for a non-volatile memory including a plurality of memory cells each comprising a floating gate facing a substrate through a first insulation film and a control gate provided on the floating gate through a second insulation film, the controller comprising:

a first means for applying a first voltage pulse to a selected memory cell for removing stored charges from the floating gate of the selected memory cell with tunneling currents through the first insulation film to commence an erasing operation for the selected memory cell; and a second means for applying a pair of positive and negative voltage pulses, with respect to the substrate, to the control gate of the memory cell to remove trapped charges from the first insulation film after the application of the first voltage pulse.

Since charges are removed from the first insulation film for each erasing, deterioration of memory performance is prevented and the number of times that cell data are erased and written is increased.

DETAILED DESCRIPTION OF THE PREFERRED EMBODIMENTS

Figure 1:
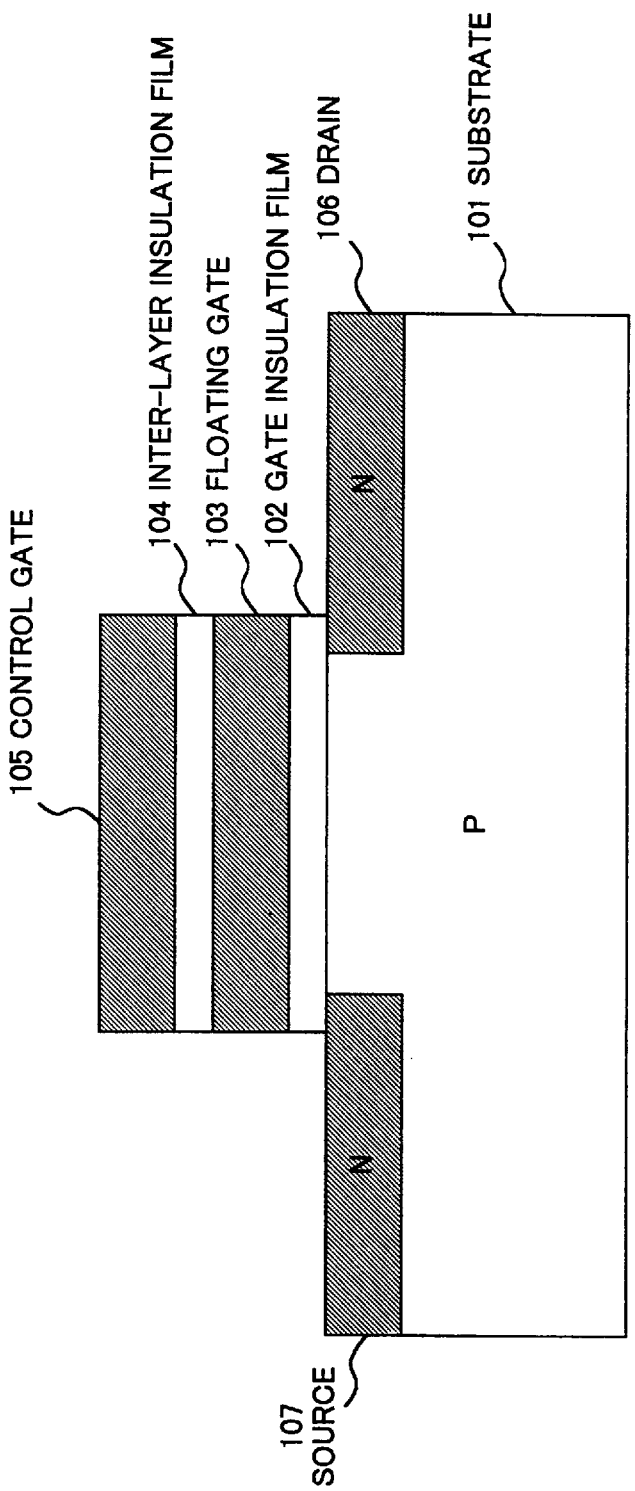
FIG. 1 is a schematic sectional view showing a non-volatile memory cell.

As shown in FIG. 1, taking a stacked gate type flash memory cell as an example, a P-type semiconductor substrate 101 is provided with a gate insulation (tunnel insulation) film 102 of approximately 10 nm or 100 angstroms thickness on the surface thereof. On the gate insulation film 102, a floating gate 103 of polycrystalline silicon, an inter-layer insulation film 104 of about 250 angstroms thickness, and a control gate 105 are sequentially deposited to form a stacked gate. When the floating gate 103 has been formed, a drain region 106 and a source region 107 are formed using an N-type impurity in the surface of the P-type substrate 101.

When writing or injection of electrons is performed, a positive voltage of 7 V is applied to the drain 106 with the substrate 101 and the source 107 grounded. In addition, a positive voltage of 12 V may be applied to the control gate 105 at that time. The potential of the floating gate 103 is uniquely determined depending on the potential of the control gate 105 coupled to the floating gate through the inter-layer insulation film 104 and the respective potentials of the substrate 101, the drain 106 and the source 107 which are coupled to the floating gate 103 through the gate insulation film 102. When the floating gate 103 is set to the same potential as the drain 106, it is found that a sufficient number of hot electrons generated from the current flowing from the drain 106 to the source 107 tunnel through the gate insulation film 102 into the floating gate 103. Therefore, in most cases, the respective voltages of the substrate 101, the control gate 105, the drain 106 and the source 107 are set as described above. Since the injected electrons cause the potential of the floating gate 103 to drop to a negative level, the threshold level of the cell which is normally set to about 7 V is shifted in the positive direction. Therefore, the memory cell is set to one of two threshold states depending on the presence or absence of the injected electrons in the floating gate 103.

Erasing or discharge of the injected electrons according to a first embodiment of the present invention will be described hereinafter.

Figure 2:
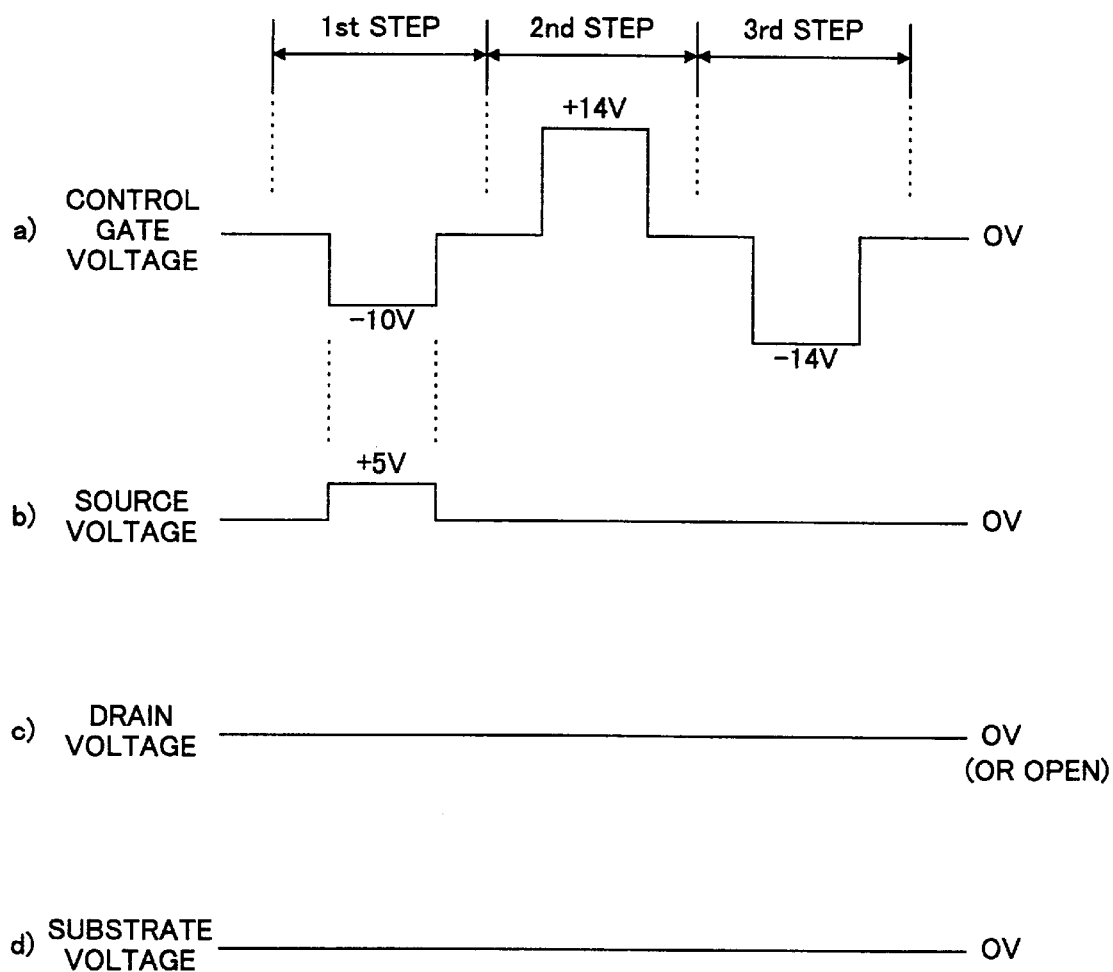
FIG. 2 is a timing chart showing a control method for the non-volatile memory cell according to a first embodiment of the present invention.

Referring to FIG. 2, in the first step, a negative voltage (e.g. −10 V) is applied to the control gate 105 and a positive voltage (e.g. +5 V) is applied to the source 107 while both the substrate 101 and the drain 106 are grounded. Since the floating gate 103 is at a negative potential in the presence of the injected electrons as described above, a strong electric field is applied to the gate insulation film 102 intervening between the floating gate 103 and the source 107. This generates the F-N tunneling current flowing from the source 107 to the floating gate 103 through the gate insulation film 102, resulting in the discharge of the injected electrons from the floating gate 103. Needless to say, such an effect can be obtained by applying a positive voltage, for example, 12 V, to the source 107 to generate the F-N tunneling current flowing from the source 107 to the floating gate 103.

At the same time, as described before, pairs of electron and hole are generated due to the tunneling phenomena of electrons from the valence band to the conduction band in a strong depletion layer formed in the side of the substrate 101 facing the source 107 when the positive voltage 5 V is applied to the source 107. The generated electrons move into the source 107 and the generated holes are mostly injected into the substrate 101 but partly into the gate insulation film 102.

In the second step, a positive high voltage (e.g. +14 V) is applied to the control gate 105 while the substrate 101, the drain 106 and the source 107 are grounded. In the third step following the second step, a negative high voltage (e.g. −14 V) is applied to the control gate 105 while the substrate 101, the drain 106 and the source 107 are grounded. The positive high voltage and the negative high voltage in the second and third steps may have the same magnitude but different polarities (the positive and negative polarities). A combination of the second and third steps is performed after the first step, causing the trapped holes in the gate insulation film 102 to be mostly emitted as will be described hereinafter.

Figure 3:
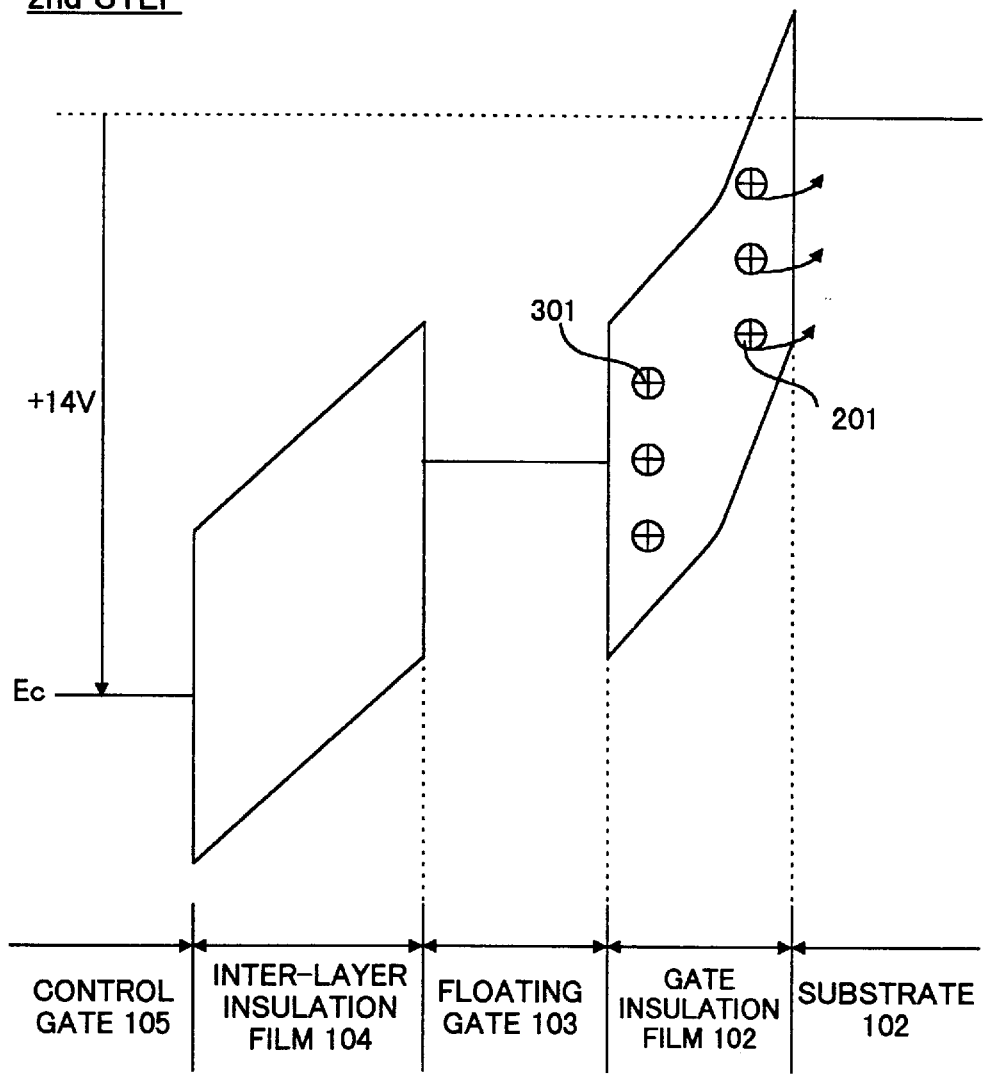
FIG. 3 is an energy band diagram showing a potential state in the second step where a negative voltage is applied to the control gate.

Referring to FIG. 3, after the first step, the trapped holes 201 and 301 are in the gate insulation film 102. When the positive voltage of 14 V is applied to the control gate 105 while the substrate 101, the drain 106 and the source 107 are grounded in the second step, the majority of the trapped holes 201 in the side of the gate insulation film 102 facing the substrate 101 are moved to the substrate 101.

Figure 4:
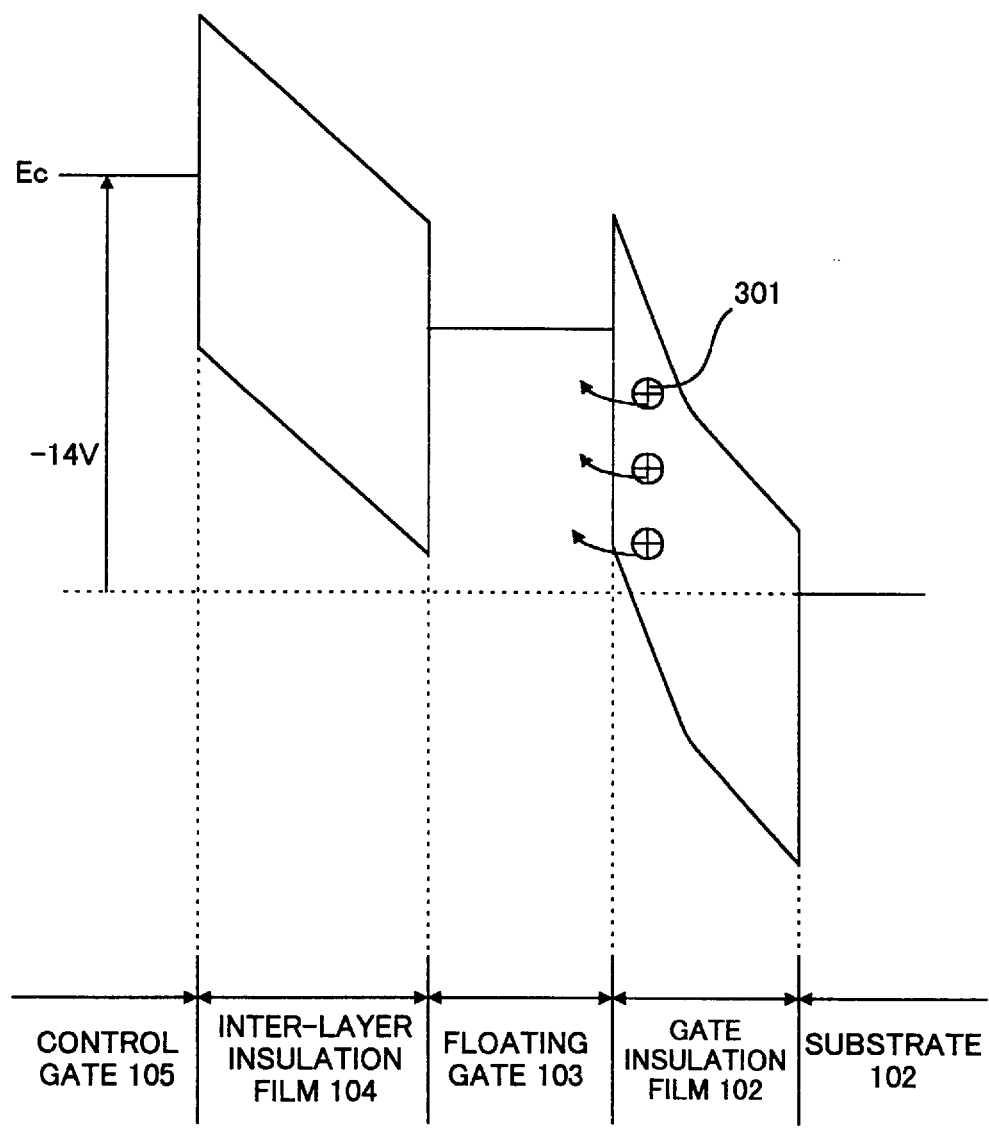
FIG. 4 is an energy band diagram showing a state in the third step where a positive voltage is applied to the control gate.

Referring to FIG. 4, after the second step, the negative voltage of 14 V is applied to the control gate 105 while the substrate 101, the drain 106 and the source 107 are grounded in the third step. The third step causes the majority of trapped holes 301 in the side of the gate insulation film 102 facing the floating gate 103 to be moved to the floating gate 103. The drain 106 may be open rather than grounded in the first to third steps.

Erasing or discharge of the injected electrons according to a second embodiment of the present invention will be described hereinafter. The combination of the second and third steps may be repeated two or more times. Such a repetition improves the efficiency of removing the injected electrons from the gate insulation film 102.

Figure 5:
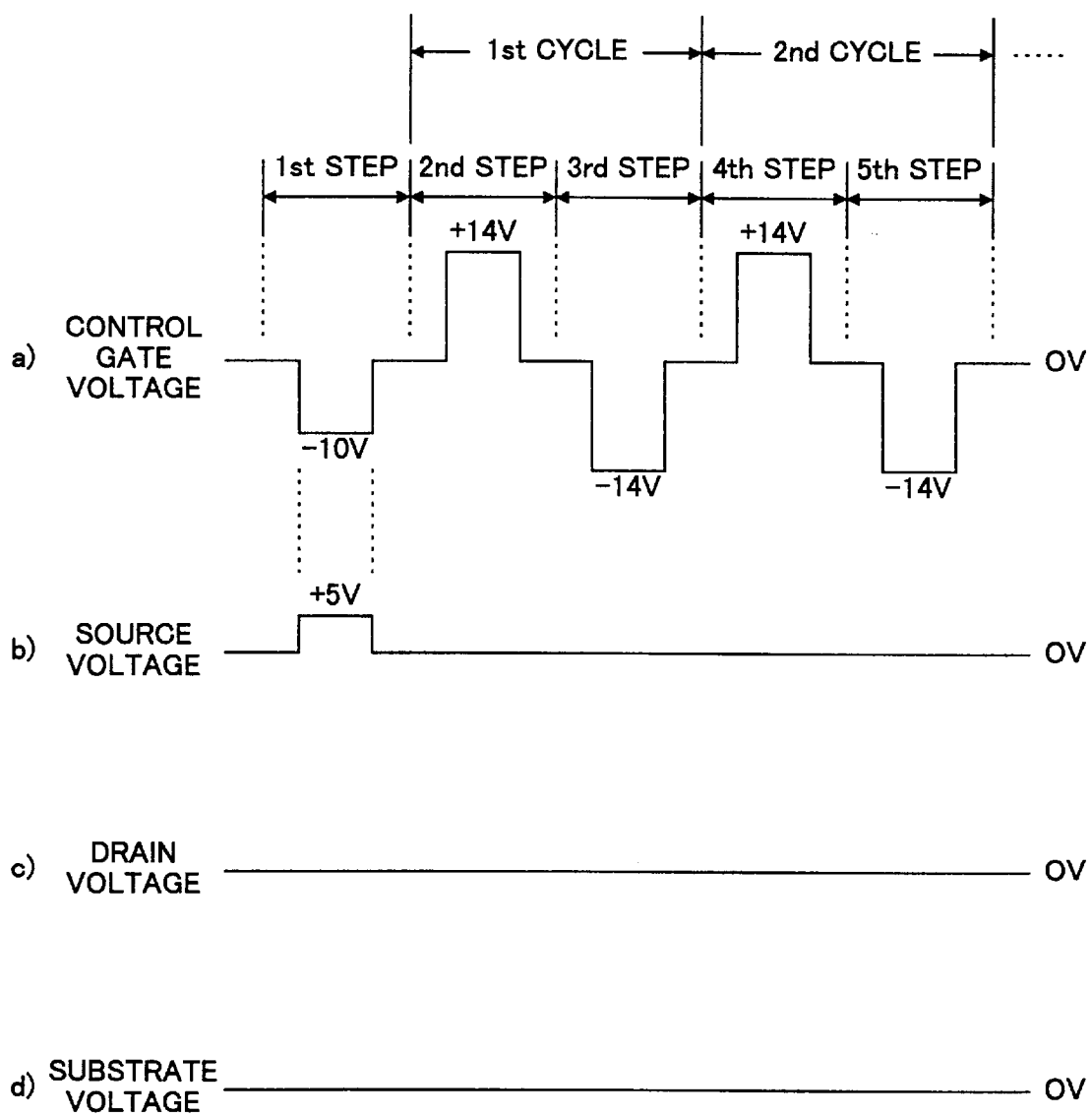
FIG. 5 is a timing chart showing a control method for the non-volatile memory cell according to a second embodiment of the present invention.
Figure 6:
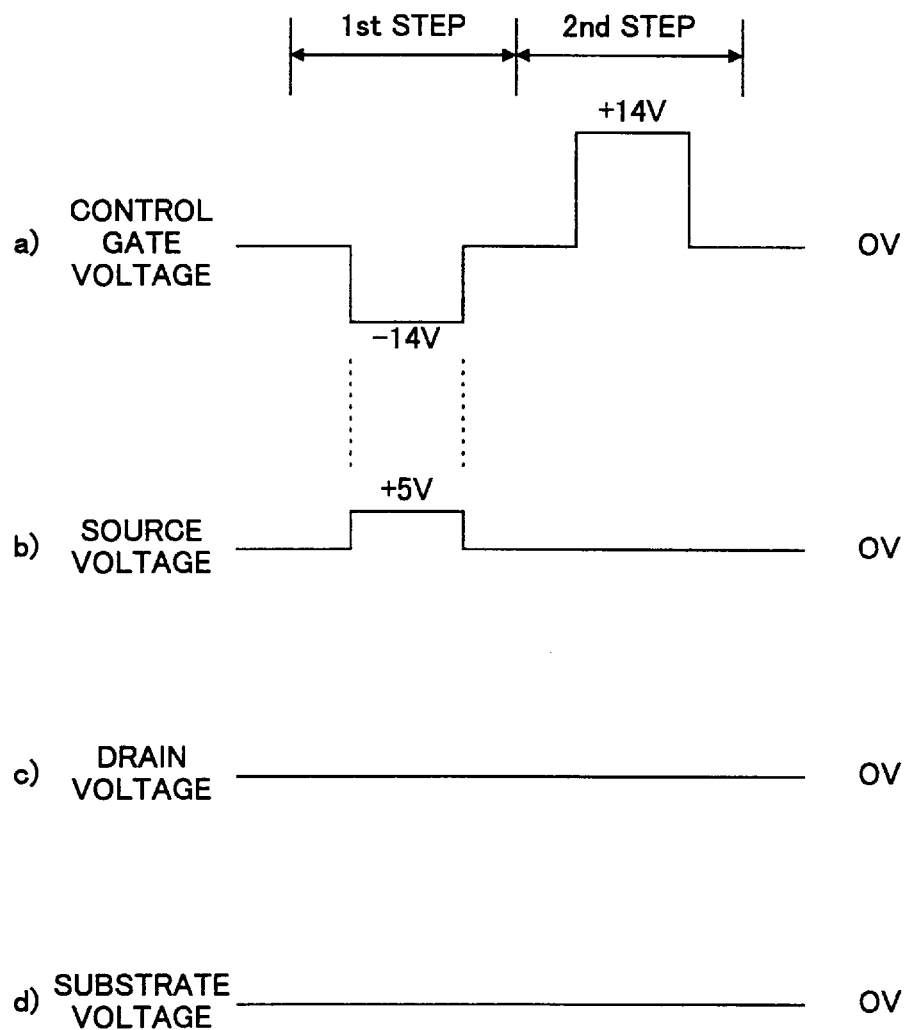
FIG. 6 is a timing chart showing a conventional 2-step erasing method for a non-volatile memory cell.

Referring to FIG. 5, the first to third steps is followed by fourth and fifth steps which are the same as the second and third steps, respectively as shown in FIG. 4. In other words, in this embodiment, the second and third steps are repeated two times. Since the repetition of the second and third steps effectively removes trapped electrons from the gate insulation film 102, deterioration of memory performance caused by writing is prevented.

As described above, after injected electrons are removed from the floating gate, a pair of positive and negative voltages is applied to the control gate at least one time to remove trapped charges from the gate insulation film. More specifically, the trapped charges in the respective sides of the gate insulation film facing the substrate and the floating gate are mostly emitted by applying the pair of positive and negative voltages to the control gate one or times. Therefore, a more reduced number of trapped charges are left in the gate insulation film, resulting in maintained memory performance even when writing is repeatedly performed.

What is claimed is:

1. In a memory cell of a non-volatile memory, the memory cell comprising a floating gate facing a substrate through a first insulation film and a control gate provided on the floating gate through a second insulation film, a control method for the memory cell comprises the steps of:

removing injected charges from the floating gate with tunneling currents through the first insulation film; and removing charges from the first insulation film after the step of removing the injected charges.

2. The control method according to claim 1, wherein the charges are removed from the first insulation film by swinging a potential of the floating gate between positive and negative predetermined levels with respect to the substrate.

3. The control method according to claim 2, wherein the charges are removed from the first insulation film by swinging the potential of the floating gate one time between positive and negative predetermined levels with respect to the substrate.

4. The control method according to claim 2, wherein the charges are removed from the first insulation film by swinging the potential of the floating gate a plurality of times between positive and negative predetermined levels with respect to the substrate.

5. The method of claim 1, wherein said injected charge carriers are electrons and the charges removed from the first insulation film are holes.

6. In memory cell of a non-volatile memory, the memory cell comprising a floating gate facing a substrate through a first insulation film and a control gate provided on the floating gate through a second insulation film, a control method for the memory cell comprises the steps of:

removing stored charges from the floating gate with tunneling currents through the first insulation film using a first voltage pulse; and applying a pair of positive and negative voltage pulses, with respect to the substrate, to the control gate to remove trapped charges from the first insulation film after the step of applying the first voltage pulse.

7. The control method according to claim 6, wherein the pair of positive and negative voltage pulses are applied to the control gate one time after the step of applying the first voltage pulse.

8. The control method according to claim 6, wherein the pair of positive and negative voltage pulses are applied to the control gate a plurality of times after the step of applying the first voltage pulse.

9. The control method according to claim 5, wherein the positive and negative voltage pulses are both set to a predetermined magnitude of voltage with respect to the substrate which is grounded.

10. The method of claim 9, wherein said positive and negative voltage pulses are of equal magnitude and opposite polarity.

11. The control method according to claim 6, wherein the stored charges are removed from the floating gate by applying a first voltage pulse to the control gate.

12. The method of claim 6, wherein said stored charge carriers are electrons and the charges removed from the first insulation film are holes.

13. In a memory cell of a non-volatile memory, the memory cell comprising:

a semiconductor substrate with a source and a drain formed therein;

a floating gate facing the semiconductor substrate through a first insulation film, the floating gate located between the source and the drain; and a control gate provided on the floating gate through a second insulation film, a control method for the memory cell comprises the steps of:

a) removing stored charges from the floating gate with tunneling currents through the first insulation film; and b) applying a pair of positive and negative voltage pulses, with respect to the semiconductor substrate, to the control gate to remove trapped charges from the first insulation film after the step (a) is performed.

14. The control method according to claim 13, wherein, in the step (b), the pair of positive and negative voltage pulses are applied to the control gate one time.

15. The control method according to claim 13, wherein, in the step (b), the pair of positive and negative voltage pulses are applied to the control gate a plurality of times.

16. The control method according to claim 13, wherein the step (a) comprises generating a difference in potential between the semiconductor substrate and the floating gate.

17. The control method according to claim 16, wherein the step (a) comprises applying a voltage pulse to the control gate.

18. The control method according to claim 10, wherein the step (a) comprises the step of enhancing a difference in potential between the source and the floating gate.

19. The control method according to claim 18, wherein the step (a) comprises the steps of:

applying a first voltage pulse to the control gate; and applying a second voltage pulse to the source, the second voltage pulse having an opposite polarity to the first voltage pulse.

20. The control method according to claim 18, wherein the step (a) comprises the step of applying a voltage pulse to the source.

21. The control method according to claim 13, wherein the positive and negative voltage pulses are both set to a predetermined magnitude of voltage with respect to the substrate which is grounded.

22. In a flash memory including a plurality of memory cells each comprising a floating gate facing a substrate through a first insulation film and a control gate provided on the floating gate through a second insulation film, an erasing method for the non-volatile memory comprises the steps of:

at a selected memory cell, removing stored charges from the floating gate of the memory cell with tunneling currents through the first insulation film using a first voltage pulse; and applying a pair of positive and negative voltage pulses, with respect to the substrate, to the control gate of the memory cell to remove trapped charges from the first insulation film after the step of applying the first voltage pulse.

23. The method of claim 22, wherein said positive and negative voltage pulses are of equal magnitude and opposite polarity.

24. A controller for a non-volatile memory including a plurality of memory cells each comprising a floating gate facing a substrate through a first insulation film and a control gate provided on the floating gate through a second insulation film, the controller comprising:

a first means for applying a first voltage pulse to a selected memory cell for removing stored charges from the floating gate of the selected memory cell with tunneling currents through the first insulation film; and a second means for applying a pair of positive and negative voltage pulses, with respect to the substrate, to the control gate of the memory cell to remove trapped charges from the first insulation film after the application of the first voltage pulse.

* * * * *